United States Patent
Roessler

(10) Patent No.: US 8,248,738 B2
(45) Date of Patent: Aug. 21, 2012

(54) SWITCHING DEVICE, HIGH POWER SUPPLY SYSTEM AND METHODS FOR SWITCHING HIGH POWER

(75) Inventor: Werner Roessler, Neufahrn (DE)

(73) Assignee: Infineon Technologies AG, Neubiberg (DE)

( * ) Notice: Subject to any disclaimer, the term of this patent is extended or adjusted under 35 U.S.C. 154(b) by 663 days.

(21) Appl. No.: 12/182,026

(22) Filed: Jul. 29, 2008

(65) Prior Publication Data
US 2010/0026429 A1    Feb. 4, 2010

(51) Int. Cl.
*H02H 3/00* (2006.01)
*H02H 7/00* (2006.01)

(52) U.S. Cl. ................... 361/8; 361/2; 361/13

(58) Field of Classification Search ............... 361/2–14; 218/8
See application file for complete search history.

(56) References Cited

U.S. PATENT DOCUMENTS

| | | | |
|---|---|---|---|
| 4,420,784 A * | 12/1983 | Chen et al. | 361/7 |
| 4,598,330 A | 7/1986 | Woodworth | |
| 4,628,230 A * | 12/1986 | Krokaugger | 315/307 |
| 4,658,320 A | 4/1987 | Hongel | |
| 4,959,746 A | 9/1990 | Hongel | |
| 5,081,558 A | 1/1992 | Mahler | |
| 5,822,563 A | 10/1998 | Sitbon et al. | |
| 6,072,673 A * | 6/2000 | Chen et al. | 361/9 |
| 6,211,701 B1 | 4/2001 | Kuijk et al. | |
| 6,621,668 B1 | 9/2003 | Sare | |
| 6,643,112 B1 | 11/2003 | Carton et al. | |
| 6,671,142 B2 | 12/2003 | Beckert et al. | |
| 6,741,435 B1 | 5/2004 | Cleveland | |
| 7,066,749 B2 | 6/2006 | Borrego Bel et al. | |
| 7,079,363 B2 | 7/2006 | Chung | |
| 7,259,945 B2 | 8/2007 | Cleveland | |
| 7,342,754 B2 | 3/2008 | Fitzgerald et al. | |
| 7,385,791 B2 | 6/2008 | Ness | |
| 2002/0171983 A1 | 11/2002 | Brooks, Jr. | |
| 2003/0193770 A1 | 10/2003 | Chung | |
| 2004/0027734 A1 | 2/2004 | Fairfax et al. | |
| 2004/0165322 A1 | 8/2004 | Crawford et al. | |
| 2007/0014055 A1* | 1/2007 | Ness | 361/2 |
| 2008/0112097 A1 | 5/2008 | Maharsi et al. | |
| 2008/0143462 A1* | 6/2008 | Belisle et al. | 335/201 |

FOREIGN PATENT DOCUMENTS
EP    0 810 618 A1    12/1997

OTHER PUBLICATIONS

European Search Report received in European Patent Application No. 09007949.2, mailed May 24, 2012, pp. 3.

* cited by examiner

*Primary Examiner* — Rexford Barnie
*Assistant Examiner* — Christopher Clark
(74) *Attorney, Agent, or Firm* — Slater & Matsil, L.L.P.

(57) ABSTRACT

Embodiments of the invention relate to a switching device, a high power supply system and methods for switching high power including a relay and a power semiconductor switch arranged in parallel to the relay.

23 Claims, 3 Drawing Sheets

SWITCHING DEVICE, HIGH POWER SUPPLY SYSTEM AND METHODS FOR SWITCHING HIGH POWER

TECHNICAL FIELD

The present invention relates generally to a switching device, a high power supply system and methods for switching high power.

BACKGROUND

Today, in many technical fields, electrical switching devices for switching higher electrical powers are needed. For example, powerful electric motors that have to be switched on or off are used in production machines, industrial electric vehicles and increasingly in private hybrid electric vehicles.

In the following, for illustration purposes, embodiments of the invention will be described with reference to a switching device, for instance, a high power switch used as a main battery switch in a hybrid electric vehicle. However, the invention is not so limited a may find its application in conjunction with any other type of high power electric consumer load.

Main battery switches in hybrid electric vehicles have to switch higher voltages, e.g. in the range of 100 V to 300 V at currents in the range of 100 A. Of course, in other applications, lower or higher voltages at lower or higher currents may also need to be switched.

Although, especially with regard to a hybrid electric vehicle, it is highly sensible to power down all consumer loads, and, in particular, the electric motor. However, for security reasons, a mode has to be provided for safely disconnecting the electric motor from a corresponding high power battery under full load conditions in case of an emergency.

Generally switching devices may be based on different switching components such as for instance, Metal Oxide Field Effect Transistors (MOSFETs), Insulated Gate Bipolar Transistors (IGBTs), relays etc.

MOSFETs are widely used as power semiconductor switches. However, depending on the requirements of the respective application, MOSFETs may exhibit on-state resistances that cause too high dissipation losses within the MOSFET when it is switched on.

For example, in an application using the best currently available 600 V-type MOSFETs, which typically exhibit an on-state resistance (RDSon) of 50 mΩ, a typical current of 100 A leads to a power dissipation of 500 W. Since these types of MOSFETs are typically comparatively expensive, a technical feasible parallel connection of several MOSFETs—in order to reduce the overall on-state resistance of the parallel MOSFETs, represents no practical solution with regard to costs.

IGBTs form another type of power semiconductor switches. One characteristic of IGBTs is their substantially constant on-state voltage of almost 2 V. In an application, in which a current of 100 A has to be switched, the constant on-state voltage of 2 V leads to an on-state dissipation loss of the IGBT switch of up to 200 W.

Furthermore, relays represent convenient devices for switching high electrical power. An advantage of relays is the fact that, by choosing appropriate contacts for the relay, on-state resistances of 0.5 mΩ of the respective switching device may be achieved in a cost-effective manner. For the purpose of comparison, in the above mentioned application case with a 100 A current to be switched, such a relay yields an on-state power loss of as low as 5 W.

However, relays suffer from one important disadvantage, namely an electric arc that is generated between the contacts of the relay when the relay switches higher currents at voltages above approximately 20 V.

This effect is even more severe for a relay switching DC voltages, since, in case of an application wherein a relay switches an AC. voltage, the first zero crossing of the AC voltage results in a secure extinction of the electric arc. However, in the case of the DC voltage, the electric arc will persist and will inevitably lead to the destruction of the corresponding relay.

For these or other reasons, there is a need for the present invention.

SUMMARY OF THE INVENTION

A switching device, a high power supply system and a method for switching high power are provided, substantially as shown in and/or described in connection with at least one of the figures.

Further features and advantages of embodiments of the present invention will become apparent from the following detailed description of embodiments of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

DETAILED DESCRIPTION OF ILLUSTRATIVE EMBODIMENTS

Figure 1:
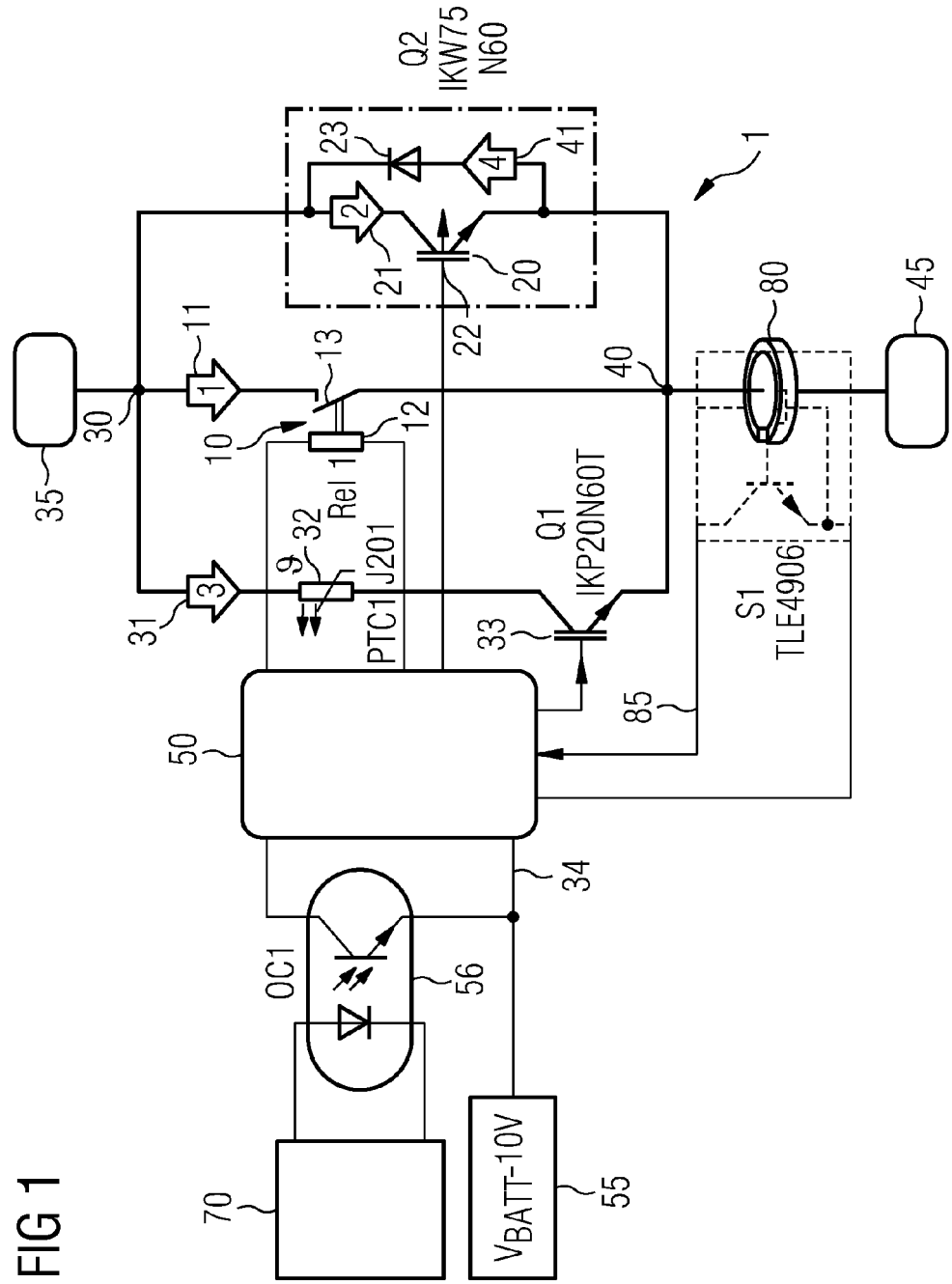
FIG. 1 shows a schematic circuit diagram of a switching device according to an embodiment of the invention embedded into a hybrid electric vehicle application.

In the following detailed description, reference is made to the accompanying drawings, which form a part thereof, and which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

An embodiment of a switching device according to the invention may comprise a combination of a relay and a power semiconductor switch, in particular a relay and a power semiconductor switch arranged in parallel to the relay. During the operation of such a switching device, the relay may enable a low-loss conduction of a higher current to a consumer load through a first current path.

During a switch-off operation of the above embodiment and shortly before the contacts of the relay are disconnected, the power semiconductor switch arranged in parallel to the relay may be turned on to provide a second current path to the consumer load. For this purpose, the power semiconductor switch may be arranged and dimensioned to take over the current from the first current path.

Since the switched-on power semiconductor switch clamps the voltage between the contacts of the relay to the on-state forward voltage of the power semiconductor switch, according to an advantageous embodiment, an insulated-gate bipolar transistor (IGBT) may be used as a power semiconductor switch.

As mentioned before, the on-state forward voltage of such an IGBT is approximately only 2 V. Hence, the voltage between the contacts of the relay may only rise to this relatively low on-state voltage of the IGBT such that the generation of an electric arc between the contacts of the relay is effectively prevented.

However, in general, alternative embodiments of the switching device may comprise other types of power semiconductor switches suited to clamp the voltage of the relay contacts during a switch-off operation to a voltage sufficiently low to prevent the generation of an electrical arc between the contacts.

In a further embodiment of the switching device, the power semiconductor switch is dimensioned to provide an effective potential equalization between the contacts of the relay in a relatively short period of time, e.g. within about 1 ms.

Hence, the power semiconductor switch providing the second current path for the high power consumer load may be turned off again comparatively soon after having been turned on. As a result, the total amount of dissipated power within the power semiconductor switch due to its series losses may be relatively low, which may eliminate the need for cooling the power semiconductor switch.

An embodiment of the switching device may comprise circuitry for causing the power semiconductor switch to switch on in response to switching off the relay. In general, this function may be implemented using any kind of coupled switches or feedback circuitry which switches on the power semiconductor switch early enough to provide the second current path before the contacts of the relay are disconnected and thus remove the first current path.

FIG. 1 shows a schematic circuit diagram of a switching device according to an embodiment of the invention embedded into a hybrid electric vehicle application. As shown, the switching device 1 is adapted to switch a high power between a first terminal 30 which may be coupled to a power in terminal 35, e.g., a high power battery (not shown) and a second terminal 40 which may be coupled to a power out terminal 45, e.g., a high power electric motor of the hybrid electric vehicle (not shown).

The switching device 1 according to the embodiment of FIG. 1 may be arranged in a high side switch configuration, i.e., the switching device 1 may be arranged between the high power battery at the power in terminal 35 and the high power electric motor at the power out terminal 45.

The switching device 1 according to the embodiment as depicted in FIG. 1 may comprise a relay 10 for providing a first current path 11 with low series resistance between the first terminal 30 and the second terminal 40 in a cost effective manner. In an embodiment, the relay may provide an on-state resistance of less than about 0.5 mΩ.

Furthermore, the switching device 1 according to the embodiment as shown in FIG. 1 comprises a first IGBT 20 as a power semiconductor switch coupled between the first terminal 30 and the second terminal 40 to provide a second current path 21 between the high power battery and the high power electric motor. In an embodiment the first IGBT 20 may provide an on-state voltage drop of less than about 3 V. In the embodiment as shown in FIG. 1, the first IGBT 20 may comprise an anti-parallel diode 23 providing a fourth current path 41 for fast reverse recovery of the first IGBT 20.

The first IGBT 20 is arranged in parallel to the relay 10 and may be turned on through the gate terminal 22 of the first IGBT 20 in response to a switch-off operation of the relay 10 prior to the disconnection of the contacts 13 of the relay 10. Hence, the second current path 21 provided by the switched-on first IGBT 20 clamps the voltage between the contacts 13 of the relay 10 to the forward on-state voltage of the first IGBT 20 and prevents an electric arc between the contacts 13 of the relay 10.

Thus using the first IGBT 20 as a controlled power semiconductor switch to provide the second current path 21 is advantageous, since the first IGBT 20 due to its IGBT characteristics may automatically clamp the contacts 13 of the relay 10 to a relatively low voltage of approximately 2 V just before the disconnection of the contacts 13. As a result, the first IGBT 20 securely prevents electric arcs from occurring between the contacts 13 of the relay 10. Hence, according to the above embodiment, the voltage between the first terminal 30 and the second terminal 40 may be clamped to a voltage too low for creating an electric arc within the relay 10 during the switch-off operation of the relay 10.

Moreover, the switching device 1 according to the embodiment as shown in FIG. 1 comprises a Positive Temperature Coefficient (PTC) resistor 32 as a current limiting component and a second IGBT 33, both coupled in series between the first terminal 30 and the second terminal 40, to provide a third current path 31. The third current path 31 may be used to charge the node of the second terminal 40, loaded with the high power electric motor which effectively represents a capacitive load, to a predetermined voltage before switching on the relay 10 during a switch-on operation of the switching device 1. In other words, a capacitive load coupled to the node of the second terminal 40 may be charged by means of the second IGBT 33 via the PTC resistor 32 as a current limiting component.

In a further embodiment of the switching device, at least the first IGBT and the relay may be integrated within a power module. This may provide a smaller overall form factor and lead to a combined component which may be more convenient to embed into a high power supply system, in particular, a high power supply system for hybrid electric vehicles.

Moreover, in embodiments comprising the PTC resistor and the second IGBT for the third current path, used to support the switch-on operation of the corresponding switching device, the PTC resistor and the second IGBT as further high power components may be integrated within the above mentioned power module too.

In the embodiment of the switching device 1 as shown in FIG. 1, the relay 10, the first IGBT 20 and the second IGBT 33 may be coupled to a sequence control circuit 50. The sequence control circuit 50 may provide circuitry for causing the first IGBT 20 to switch on via the gate terminal 22 of the first IGBT 20 in response to a switch-off operation of the relay 10.

In an embodiment of the switching device, the sequence control circuit may be implemented with discrete electronic components. In another embodiment of the switching device, the sequence control circuit may be conveniently monolithically integrated within an IC and/or may be even integrated within the above-mentioned power module to form an easy to handle and easy to embed functional single-component switching device module.

In certain embodiments, the sequence control circuit may comprise all low power circuitry used to control the first, the second and, if applicable, the third current path.

In the embodiment shown in FIG. 1, the sequence control circuit 50 may provide circuitry which at least indirectly couples the gate terminal 22 of the first IGBT 20 as a control terminal of a power semiconductor switch to a coil 12 of the relay 10.

In this embodiment, the coil 12 of the relay 10 may be dimensioned to induce a turn-on voltage for IGBT 20, e.g., a positive voltage difference of about 20 V. That is, the energy, which has been stored in the coil 12 of the relay 10 during each on-state of the relay 10, may be used during a switch-off operation of the relay 10 to automatically switch on the first IGBT 20 arranged in parallel to the relay 10 at the right instance of time, namely shortly before the contacts 13 of the relay 10 are disconnected such that the second current path 21 prevents electrical arcs from occurring between the contacts 13.

In this regard, in the embodiment according to FIG. 1 the mechanical inertia of a movable one of the contacts 13 of the relay 10 may be dimensioned such that the sequence control circuit 50 may provide the turn-on voltage for the first IGBT 20 before the contacts 13 of the relay 10 are disconnected such that no electrical arc may be generated at the contacts 13.

Dimensioning the mechanical inertia of a movable one of the contacts 13 of the relay 10 in the above described way is advantageous since, in principle, no external control circuit providing an active timing control is necessary to secure that the second current path 21 is always provided before the contacts 13 of the relay 10 are disconnected, i.e., before the first current path 11 is removed. Due to this built-in timing control the switching device is particularly safe in cases of failure.

The reuse of the coil 12 of the relay 10 as a voltage generator for switching on the parallel second current path 21 is advantageous in that it saves the usage of extra components for the voltage generation. This saved component could be an inductor or a capacitor for a bootstrap circuit.

Furthermore, in the switching device 1 according to the embodiment of FIG. 1, the energy storage capacity of the coil 12 of the relay 10 and the turn-on voltage of the first IGBT 20 may be dimensioned to provide the parallel second current path 21 for only a short period of time, e.g., for periods between about 0.5 ms and about 20 ms for preventing the necessity of any cooling effort for the first IGBT 20.

In the embodiment of the switching device 1 shown in FIG. 1, the relay 10 may be driven by an auxiliary voltage 55 with a magnitude of about 10 V. In the embodiment, the auxiliary voltage 55 is provided to the relay 10 via the sequence control circuit 50.

In embodiments in which the first IGBT 20 is arranged as a high side switch like in the embodiment of FIG. 1, the auxiliary voltage 55 to drive the relay 10 may be referenced to the voltage at the first terminal 30, e.g., the positive terminal of the high power battery, namely a lithium-ion accumulator with a supply voltage $V_{BATT}$ of 165 V. In this way, the voltage induced in the coil 12 of the relay 10 is also referenced to the voltage at the first terminal 30 and may be used, if appropriately poled, to turn on the first IGBT 20.

The auxiliary voltage 55 for the relay 10 may be taken from the high power battery block. For this purpose, an intermediate terminal 34 of the high power battery comprising a series of cells (e.g., 50 lithium-ion accumulator cells) may be coupled to the relay 10 via the sequence control circuit 50 to provide the suitable auxiliary voltage 55 for the relay 10. In this way, an appropriately referenced turn-on voltage may be induced during a switch-off operation for the first IGBT 20, which is arranged as a high side switch and should therefore be driven by a voltage which is higher than the battery voltage $V_{BATT}$ to be switched.

In the embodiment, in which the series block of lithium-ion accumulator cells with an overall supply voltage $V_{BATT}$ is used as the high power battery, the intermediate terminal 34 may be, e.g., a conducting connection between the third and the fourth cell, counted from the positive terminal of the lithium-ion accumulator cell block to provide an auxiliary voltage 55 of $V_{BATT}-10$ V to the relay 10.

Due to the above mentioned built-in timing control, which makes use of the mechanical inertia of the contacts of the relay and the corresponding dispensability of an external/additional control, the switching device 1 may also operate properly if the auxiliary voltage 55 driving the relay 10 breaks down or is separated from the relay 10.

According to the embodiment of the switching device 1 shown in FIG. 1, the switching device may be embedded into a high power supply system, e.g., a high power supply system for a hybrid electric vehicle, in which the switching device 1 may be used as a main battery switch.

In the embodiment of the high power supply system as shown in FIG. 1, the sequence control circuit 50 may be controlled by a control output 70 of a corresponding microcontroller of the hybrid electric vehicle to provide a safe shutdown of the high power electric motor by correspondingly controlling the switching device 1 in case the microcontroller detects a failure condition. For level shift reasons, the control output 70 of the microcontroller may be coupled to the sequence control circuit 50 and the intermediate terminal 34, which provides the auxiliary voltage 55, via an optocoupler 56.

Furthermore, in the embodiment of the high power supply system as shown in FIG. 1, a control terminal 85 of a security current switch, e.g., of a hall switch 80, may be coupled to the sequence control circuit 50 to cause a switch-off operation of the high power electric motor coupled to the power out terminal 45 using the switching device 1 in case of an excess current failure.

Figure 2:
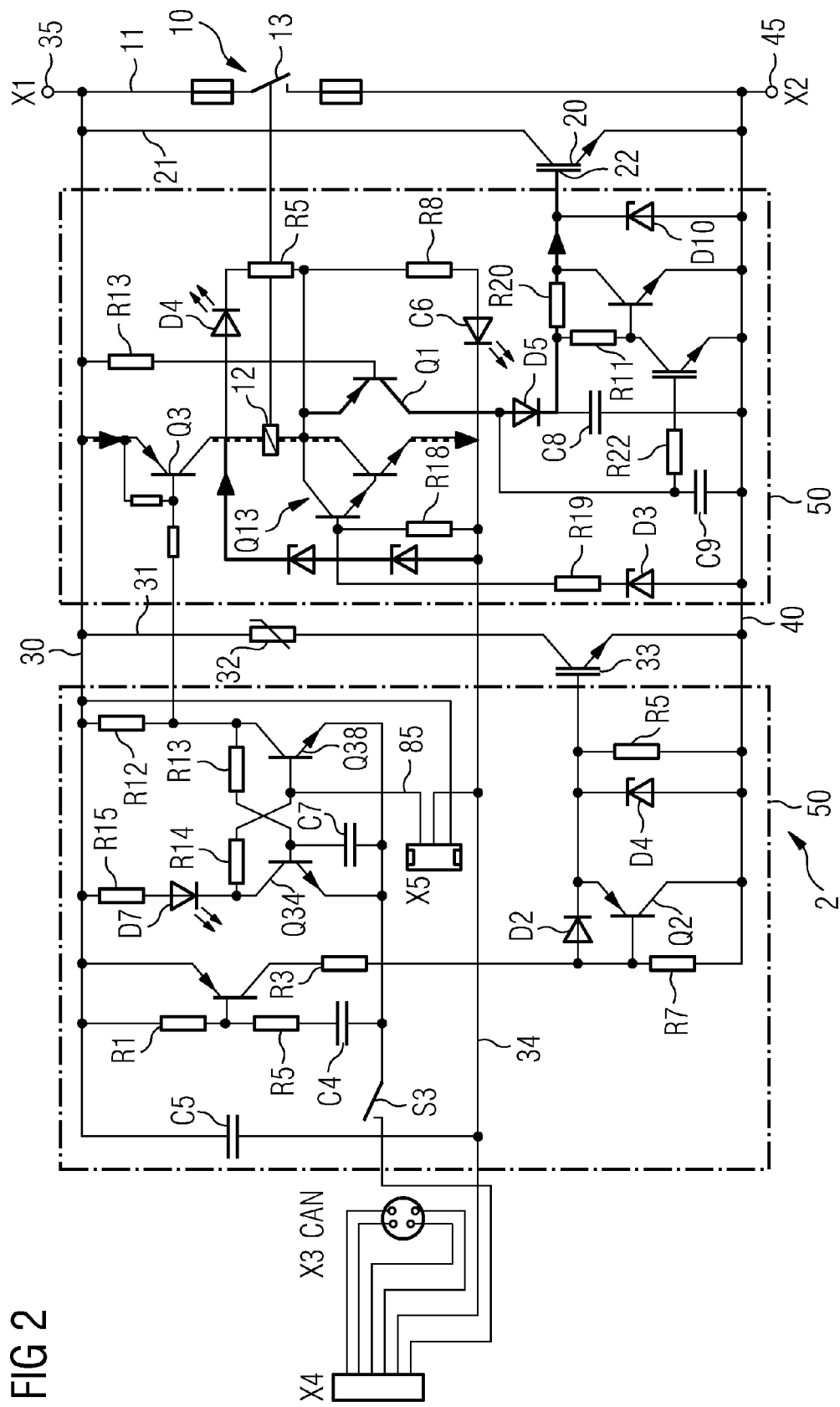
FIG. 2 shows a detailed circuit diagram of a switching device according to another embodiment of the invention.

FIG. 2 shows a detailed circuit diagram of a switching device 2 according to another embodiment of the invention. In FIG. 2 for the sake of clarity, components corresponding to components of the switching device 1 as shown in FIG. 1 have been designated with the same reference numbers.

In FIG. 2, a possible implementation of the sequence control circuit 50 is shown. In particular, a possible circuit implementation is shown for providing the auxiliary voltage from the intermediate terminal 34 of the high power battery to the coil 12 of the relay 10.

Furthermore, FIG. 2 shows an example for coupling the coil 12 of the relay 10 to the gate terminal 22 of the first IGBT 20 to use the energy stored in the coil 12, when the relay 10 and hence the coil 12 is switched off, for the generation of a voltage which is higher than the voltage at the power in terminal 35, namely the battery voltage $V_{BATT}$, which is to be switched be the first IGBT 20.

In this regard in FIG. 2, the bold dotted arrow line shows the current flow through the coil 12 of the relay 10 in the on-state of relay 10, whereas the bold drawn through arrow line shows the current flow through the coil 12 of the relay 10 in the off-state of relay 10 when the first IGBT 20 is driven by the coil 12 of the relay 10.

Figure 3:
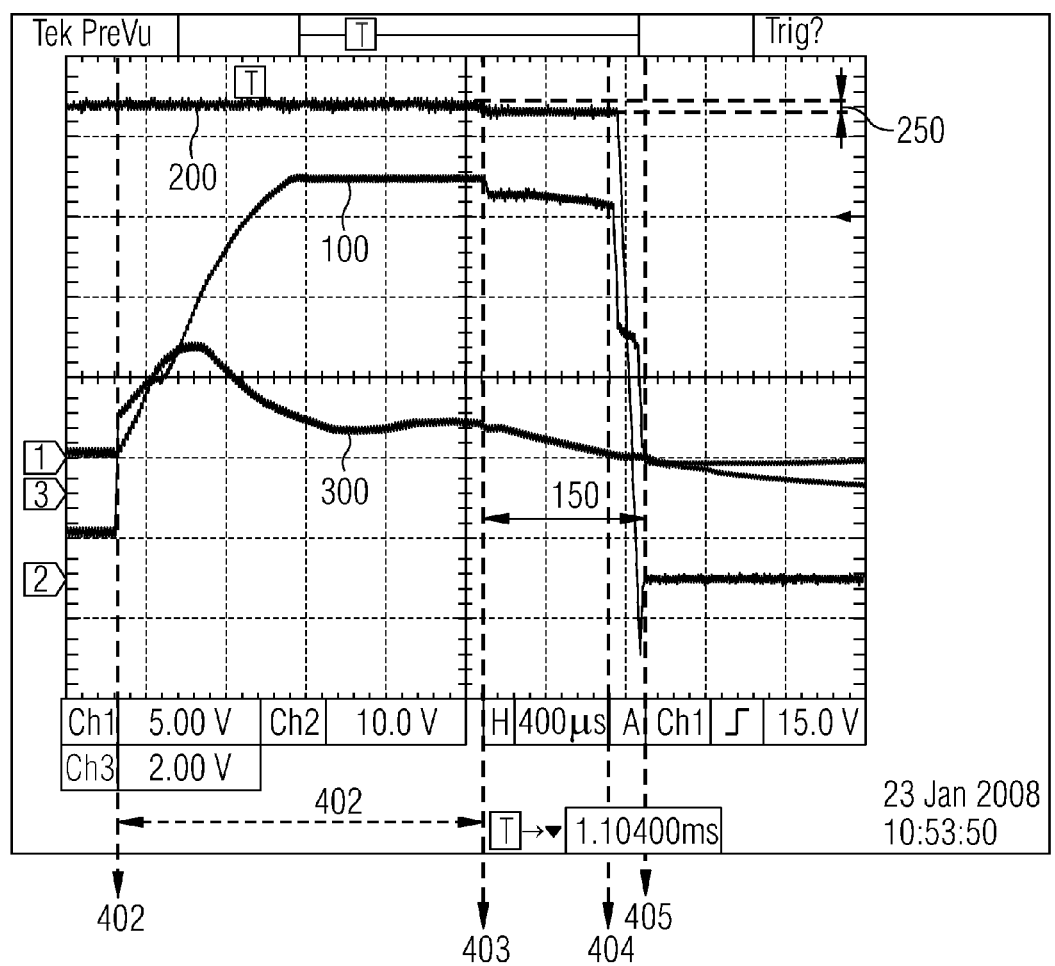
FIG. 3 shows an oscillogram of typical transient voltage characteristics of important voltages within the switching device of FIG. 2.

FIG. 3 shows an oscillogram of typical transient voltage characteristics of important voltages within the switching device 2 of FIG. 2. In FIG. 3 voltage trace 100 represents the voltage at the gate terminal 22 of the first IGBT 20. Furthermore, voltage trace 200 represents the voltage at the power out terminal 45 of the switching device 2 in FIG. 2. Voltage trace 300 represents the voltage difference between the terminals of the coil 12 of the relay 10 in FIG. 2.

Moreover, in FIG. 3 reference number 150 designates the time interval during which current flows through the first IGBT 20. With regard to the voltage trace 200 of the voltage at the power out terminal 45 of the switching device 2, the reference number 250 designates a voltage drop of approximately 2 V due to the corresponding substantially constant forward on-state voltage of the first IGBT 20.

Furthermore, in FIG. 3 reference number 401 designates the point in time at which the microcontroller output switches off the relay 10. Reference number 403 designates the point in time at which the contacts 13 of the relay 10 are actually disconnected. Hence, the time interval designated with the reference number 402 designates the hold time of the relay 10.

Finally, reference number 404 designates the point in time at which the overall switch-off operation of the power out terminal 45 starts, whereas reference number 405 designates the point in time at which the overall switch-off operation of the power out terminal 45 has finished, i.e., the voltage level at the power out terminal 45 has reached 0 V.

A further embodiment of the invention relates to a method for switching a high power between a first and a second terminal by a switching device. In this embodiment, the method comprises the steps of switching off a first current path between the first and second terminal using a relay and providing a second current path between the first and the second terminal using an IGBT in response to a switch-off operation of the relay.

A still further embodiment of the invention relates to a method for preventing an electric arc in a relay switching a high power between a first and a second terminal. In this embodiment, the method comprises the steps of using an energy stored in a coil of the relay while switching off the relay to automatically switch on a power semiconductor switch arranged in parallel to the relay.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A switching device comprising:
   a relay coupled between a first terminal and a second terminal providing a first current path;
   a first semiconductor switch coupled between the first terminal and the second terminal, the first semiconductor switch configured to provide a second current path only during a turn-off operation of the relay; and
   a second semiconductor switch coupled between the first terminal and the second terminal, the second semiconductor switch configured to provide a third current path only during a turn-on operation of the relay.

2. The switching device of claim 1, further comprising circuitry for causing the first semiconductor switch to switch on in response to switching off the relay.

3. The switching device of claim 1, wherein a control terminal of the first semiconductor switch is at least indirectly coupled to a coil of the relay.

4. The switching device of claim 3, wherein the coil of the relay is dimensioned to induce a turn-on voltage for the first semiconductor switch.

5. The switching device of claim 4, wherein mechanical inertia of a contact of the relay is dimensioned such that turn-on voltage for the first semiconductor switch is provided before an electrical arc is caused at the contact of the relay.

6. A switching device comprising:
   a relay coupled between a first terminal and a second terminal to provide a first current path;
   a first insulated-gate bipolar transistor (IGBT) coupled between the first terminal and the second terminal to provide a second current path only during turn-off operation of the relay;
   a second IGBT coupled between the first terminal and the second terminal to provide a third current path only during turn-on operation of the relay; and
   a sequence control circuit coupled between a coil of the relay and a gate terminal of the first IGBT.

7. The switching device of claim 6, wherein the sequence control circuit is adapted to provide a voltage induced in the coil of the relay when the relay is switched off to temporarily turn on the first IGBT in order to prevent an electric arc within the relay.

8. The switching device of claim 6, wherein at least the first IGBT and the relay are integrated within a power module.

9. The switching device of claim 6, wherein the sequence control circuit is integrated within an integrated circuit (IC).

10. A switching device comprising:
    a relay means for switching a high power between a first terminal and a second terminal;
    a first power semiconductor switching means for providing a first parallel current path between the first terminal and the second terminal, the first parallel current path is provided only in response to a switch-off operation of the relay means in order to prevent an electric arc within the relay means; and
    a second power semiconductor switching means for providing a second parallel current path between the first terminal and the second terminal, the second parallel current path is provided only in response to a switch-on operation of the relay means.

11. The switching device of claim 10, wherein the first power semiconductor switching means is adapted to provide the parallel current path for a period of time between 0.5 ms and 20 ms.

12. The switching device of claim 10, wherein the relay means is adapted to provide an on-state resistance of less than 0.5 mΩ.

13. The switching device of claim 10, wherein the first power semiconductor switching means is adapted to provide an on-state voltage drop of less than 3 V.

14. The switching device of claim 10, wherein the first power semiconductor switching means is adapted to clamp a voltage between the first terminal and the second terminal to a voltage being too low for creating an electric arc within the relay means during its switch-off operation.

15. A high power supply system, for a hybrid electric vehicle, the system comprising:
    a high power battery; and
    the switching device of claim 1 coupled to the high power battery as a main battery switch.

16. A method for switching a high power between a first terminal and a second terminal by a switching device, the method comprising:
    switching off a first current path between the first terminal and the second terminal using a relay;

providing a second current path between the first terminal and the second terminal using a first IGBT only in response to a switch-off operation of the relay;
switching on the first current path between the first terminal and the second terminal using the relay; and
providing a third current path between the first terminal and the second terminal using a second IGBT only in response to a switch-on operation of the relay.

17. The method of claim 16, further comprising using the switching device as a main battery switch within a hybrid electric vehicle.

18. The method of claim 16, wherein the first IGBT is arranged as a high side switch between the first terminal and the second terminal for a low side high power consumer load.

19. The method of claim 18, further comprising using an intermediate terminal of a battery comprising a series of cells to provide a suitable auxiliary voltage for the relay for inducing an appropriately referenced turn-on voltage for the first IGBT arranged as the high side switch.

20. The method of claim 16, further comprising using energy stored in a coil of the relay while switching off the relay to automatically turn on the first IGBT early enough for preventing an electric arc within the relay.

21. The method of claim 16, further comprising switching off the second current path after a period of time between 0.5 ms and 20 ms.

22. The switching device of claim 1, wherein the second semiconductor switch is arranged in series with a positive temperature coefficient (PTC) resistor.

23. The switching device of claim 6, wherein the second IGBT is arranged in series with a positive temperature coefficient (PTC) resistor.

* * * * *